US010767809B2

(12) United States Patent
Lau et al.

(10) Patent No.: US 10,767,809 B2
(45) Date of Patent: Sep. 8, 2020

(54) SUPPORT SYSTEM

(71) Applicant: Colebrook Bosson Saunders (Products) Limited, London (GB)

(72) Inventors: Alex Lau, London (GB); Andrew Wills, London (GB)

(73) Assignee: COLEBROOK BOSSON & SAUNDERS (PRODUCTS) LIMITED, London (GB)

(*) Notice: Subject to any disclaimer, the term of this patent is extended or adjusted under 35 U.S.C. 154(b) by 568 days.

(21) Appl. No.: 15/060,177

(22) Filed: Mar. 3, 2016

(65) Prior Publication Data
US 2016/0186923 A1 Jun. 30, 2016

Related U.S. Application Data

(63) Continuation of application No. 13/024,685, filed on Feb. 10, 2011, now Pat. No. 9,316,346.

(30) Foreign Application Priority Data

Jun. 9, 2010 (GB) .................................. 1009680
Aug. 11, 2010 (EM) ......................... 00174238-0002
(Continued)

(51) Int. Cl.
*F16M 13/02* (2006.01)
*F16M 11/12* (2006.01)
*F16M 11/20* (2006.01)
*H05K 5/02* (2006.01)

(52) U.S. Cl.
CPC .......... *F16M 13/02* (2013.01); *F16M 11/126* (2013.01); *F16M 11/2064* (2013.01);
(Continued)

(58) Field of Classification Search
CPC .. F16M 13/02; F16M 11/2064; F16M 13/022; F16M 11/126; F16M 2200/04;
(Continued)

(56) References Cited

U.S. PATENT DOCUMENTS 906,874 A * 12/1908 Hallowell ............... F16F 15/02
248/569
5,503,012 A * 4/1996 Rabizadeh .......... B60C 23/0496
73/146.8
(Continued)

*Primary Examiner* — Ingrid M Weinhold
(74) *Attorney, Agent, or Firm* — Michael Best & Friedrich LLP

(57) ABSTRACT

A support arm for supporting a load such as a display device. The support arm includes a housing defining an indicator window, a balancing mechanism in the housing, and an adjustment mechanism to adjust a counterbalancing force or torque provided by the balancing mechanism to counterbalance the weight of the load. The support arm further includes an indicator arrangement visible in the indicator window to provides a visual indication of the relative force or torque provided by the balancing mechanism. The indicator arrangement may include a lens in the indicator window. The indicator arrangement may include indicia to facilitate the visual indication of relative force or torque. The indicator arrangement may include a portion of the adjustment mechanism or balancing mechanism.

16 Claims, 18 Drawing Sheets

(30) Foreign Application Priority Data

| Aug. 11, 2010 | (EM) | 001742438-0001 |
| Aug. 11, 2010 | (EM) | 001742438-0003 |
| Aug. 11, 2010 | (EM) | 001742438-0004 |
| Aug. 11, 2010 | (EM) | 001742438-0005 |

(52) U.S. Cl.
CPC ......... F16M 13/022 (2013.01); H05K 5/0204 (2013.01); *F16M 2200/022* (2013.01); *F16M 2200/04* (2013.01); *F16M 2200/041* (2013.01); *F16M 2200/044* (2013.01); *F16M 2200/065* (2013.01)

(58) Field of Classification Search
CPC ....... F16M 2200/041; F16M 2200/044; F16M 2200/063; F16M 2200/022; F16M 2200/065; H05K 5/0204
USPC ... 248/123.11, 280.11, 292.11, 276.1, 277.1, 248/284.1, 291.1, 292.13
See application file for complete search history.

(56) References Cited

U.S. PATENT DOCUMENTS

| 5,975,472 | A | * | 11/1999 | Hung | F16M 11/105 |
| | | | | | 248/278.1 |
| 6,012,693 | A | * | 1/2000 | Voeller | F16M 11/048 |
| | | | | | 248/279.1 |
| 6,164,612 | A | * | 12/2000 | Schmitt | F16M 11/10 |
| | | | | | 248/274.1 |
| 6,394,403 | B1 | * | 5/2002 | Hung | F16M 11/10 |
| | | | | | 248/276.1 |
| 7,364,127 | B2 | * | 4/2008 | Huang | F16M 11/10 |
| | | | | | 248/276.1 |
| 7,464,909 | B2 | * | 12/2008 | Li | F16M 11/08 |
| | | | | | 248/274.1 |
| 7,510,155 | B2 | * | 3/2009 | Huang | F16M 11/10 |
| | | | | | 248/278.1 |
| 7,703,473 | B1 | * | 4/2010 | Hurley | F16K 31/46 |
| | | | | | 137/343 |
| 8,011,632 | B2 | * | 9/2011 | Wang | F16M 11/10 |
| | | | | | 248/284.1 |
| 9,004,431 | B2 | * | 4/2015 | Huang | F16M 11/10 |
| | | | | | 248/121 |
| 2004/0245419 | A1 | * | 12/2004 | Sweere | F16M 11/105 |
| | | | | | 248/276.1 |
| 2006/0231710 | A1 | * | 10/2006 | Huang | F16M 11/2064 |
| | | | | | 248/291.1 |
| 2007/0102596 | A1 | * | 5/2007 | Sung | F16M 11/105 |
| | | | | | 248/122.1 |
| 2010/0327129 | A1 | * | 12/2010 | Chen | F16M 11/14 |
| | | | | | 248/121 |
| 2011/0260017 | A1 | * | 10/2011 | Monsalve | F16M 11/2014 |
| | | | | | 248/201 |
| 2012/0267497 | A1 | * | 10/2012 | Bowman | F16M 11/10 |
| | | | | | 248/280.11 |
| 2013/0314890 | A1 | * | 11/2013 | Smith | F16M 11/10 |
| | | | | | 361/825 |

* cited by examiner

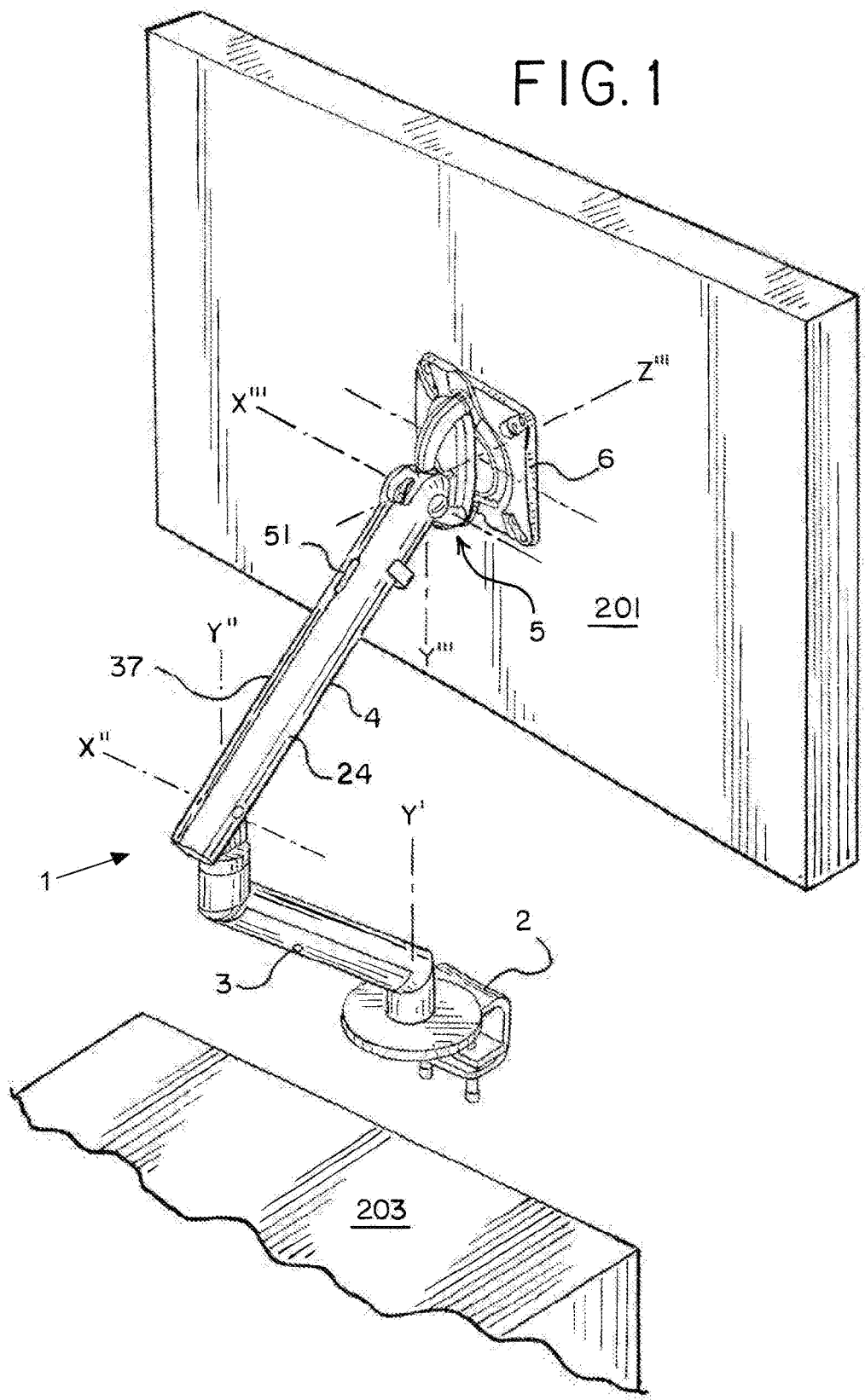

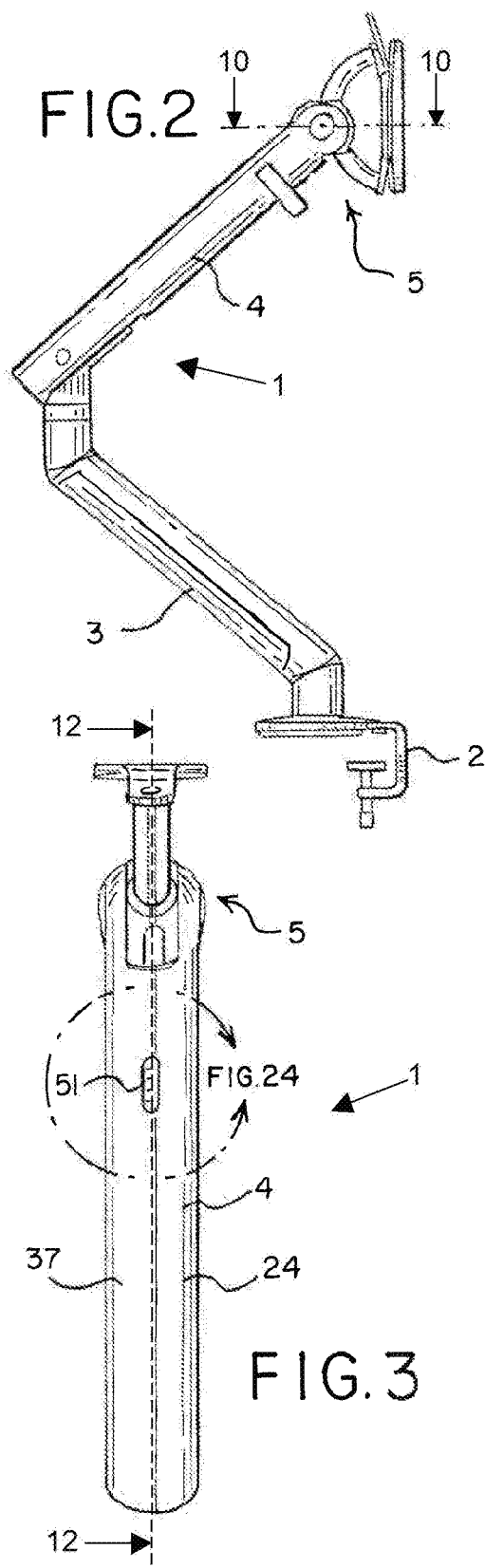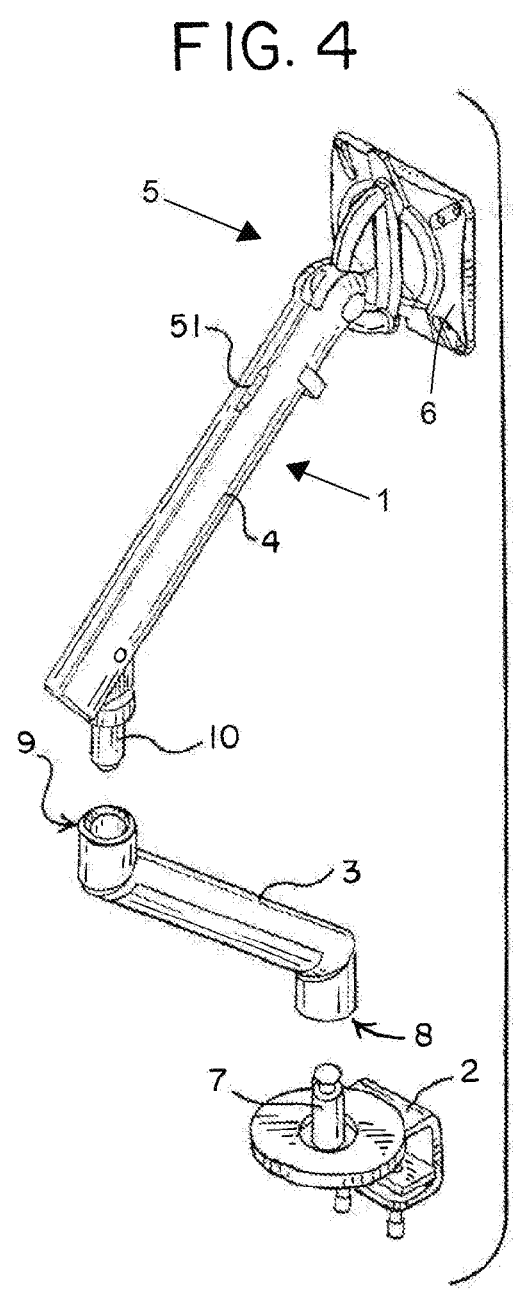

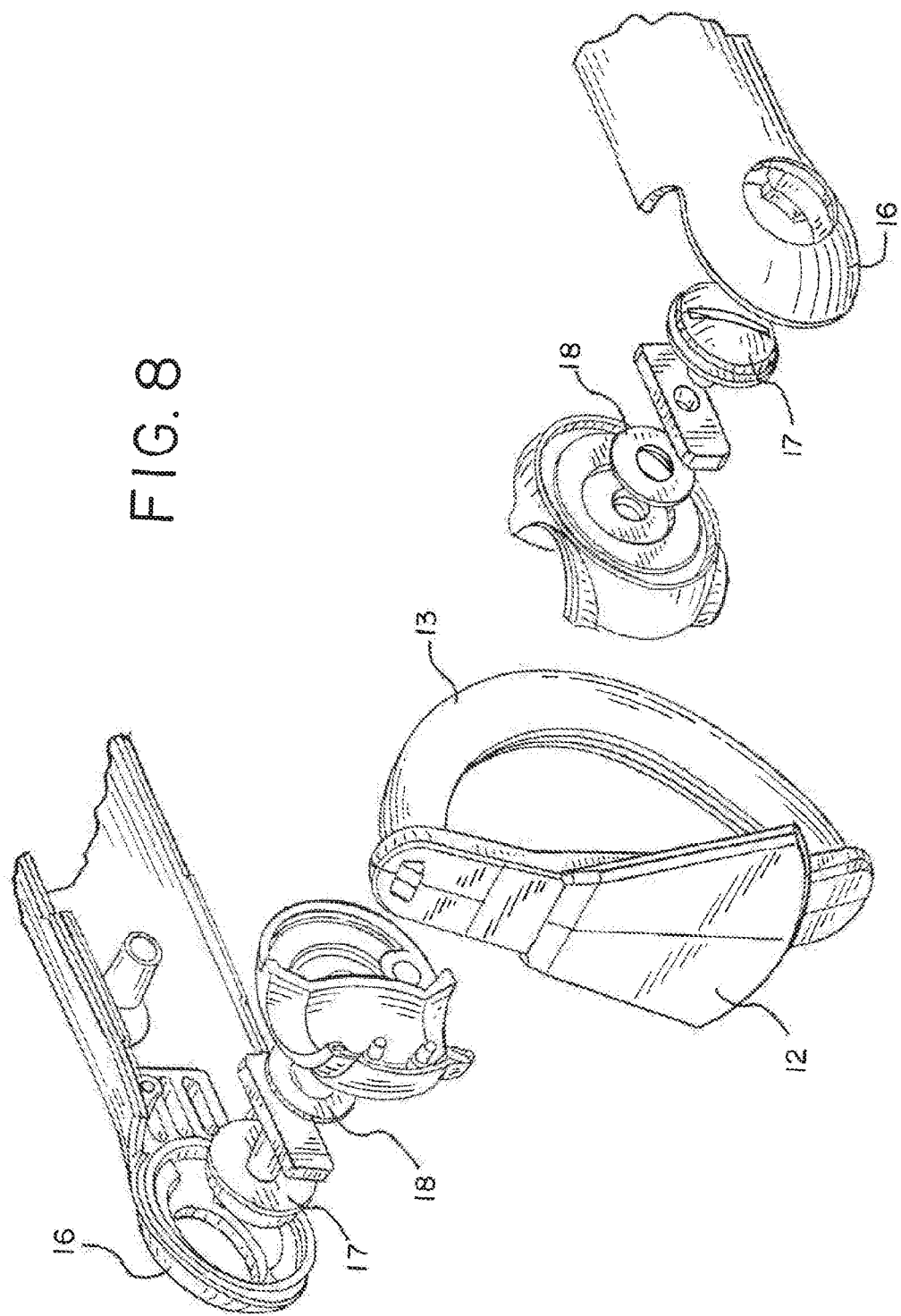

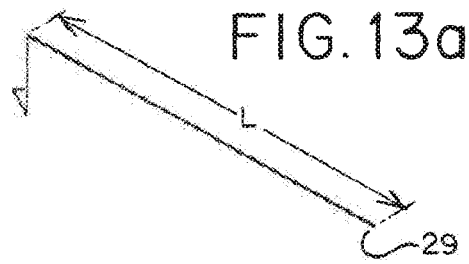
FIG. 13a
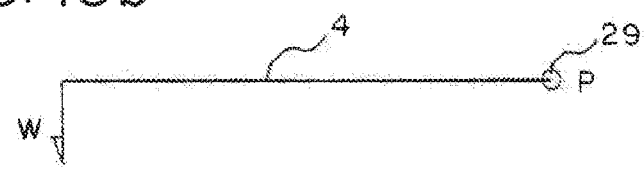
FIG. 13b
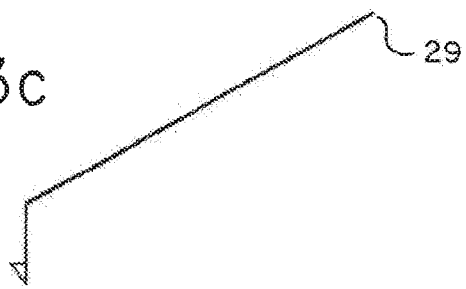
FIG. 13c
FIG. 14
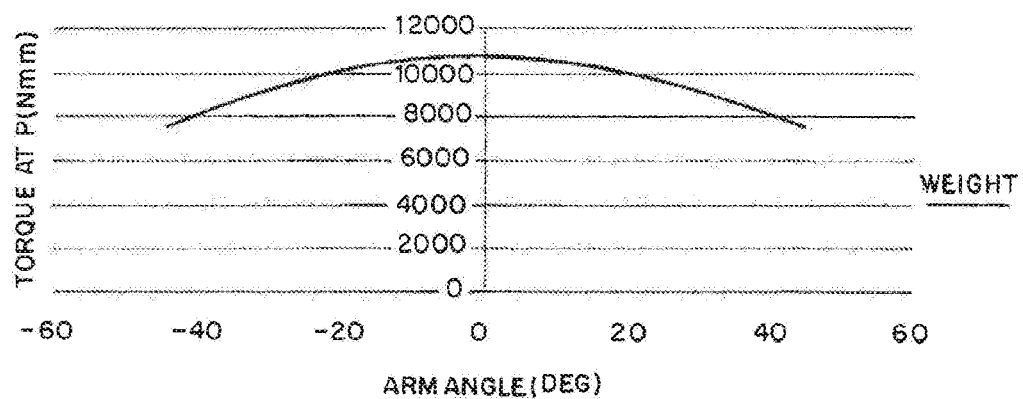

W - WEIGHT
P - PIVOT
L - ARM LENGTH
b - SLIDING DISTANCE
d - PIVOT DISTANCE
G - SPRING FORCE
S - FORCE OPPOSED BY LINK
e - DISTANCE PERPENDICULAR TO LINK (FORCE)

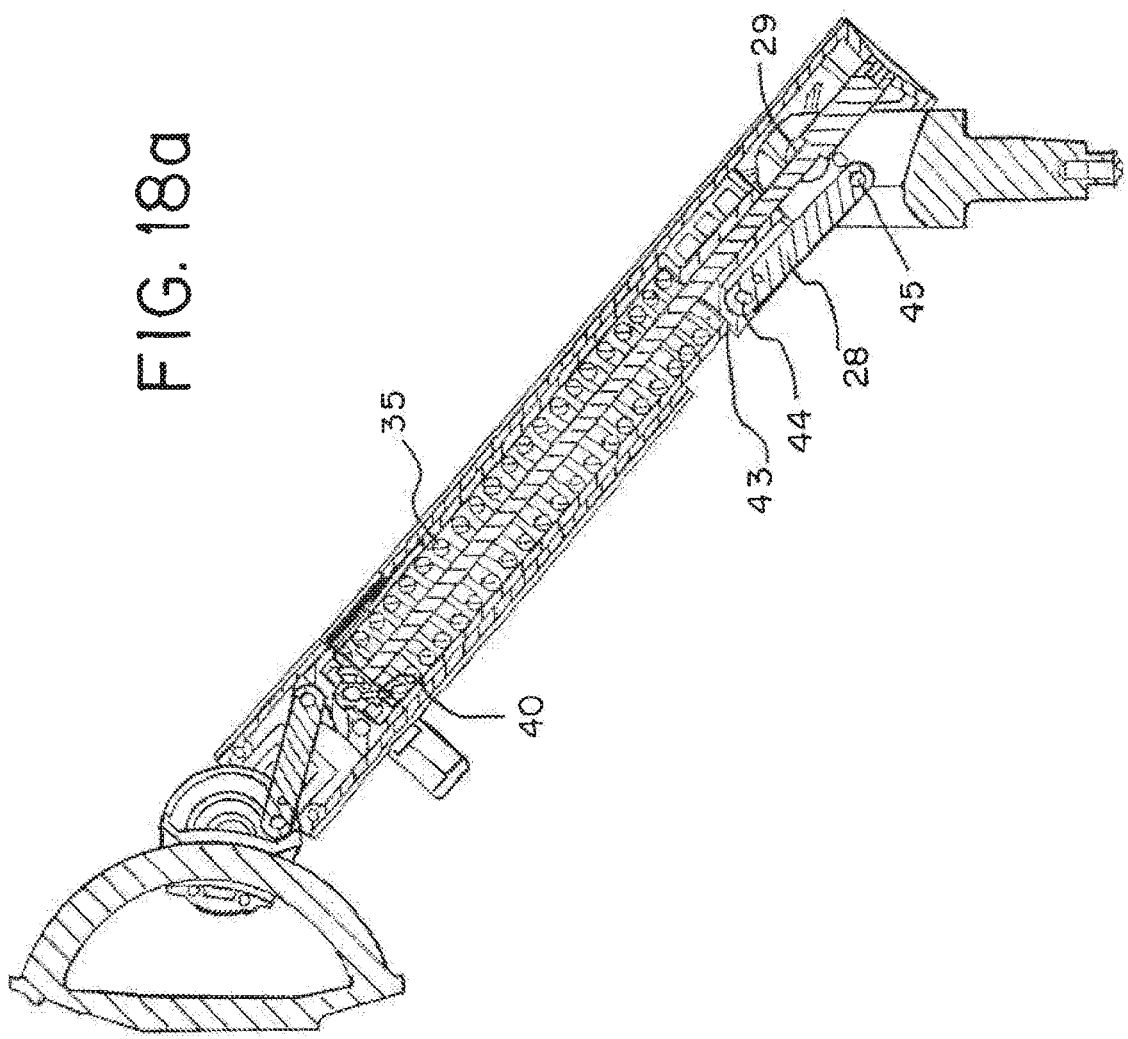

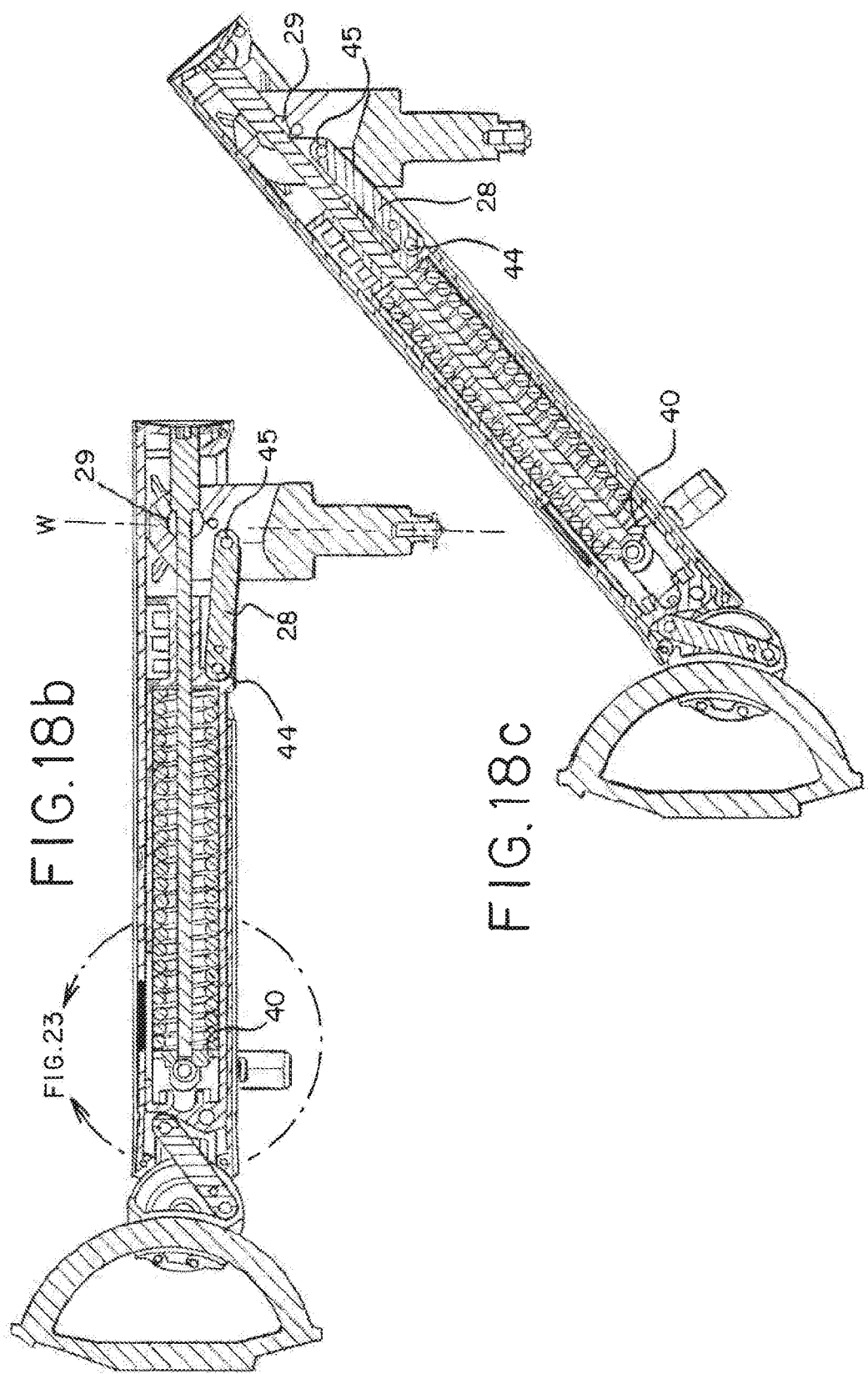

W — WEIGHT
P — PIVOT
L — ARM LENGTH
b — SLIDING DIST.
d — PIVOT DIST.
G — SPRING FORCE
S — FORCE OPPOSED BY LINK
e — DIST. PERPENDICULAR TO LINK (FORCE)
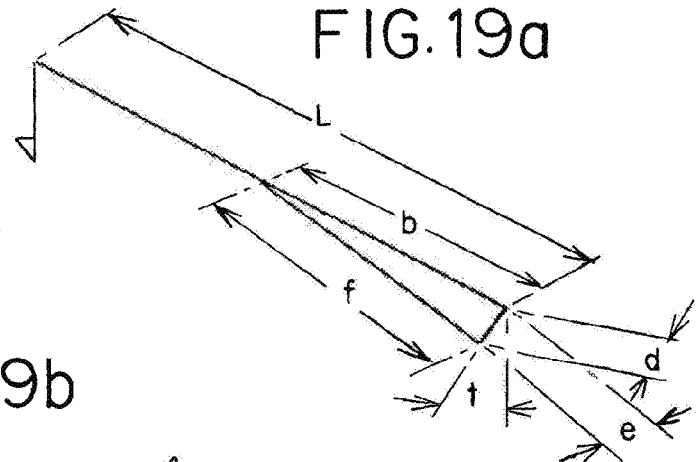
FIG. 19a
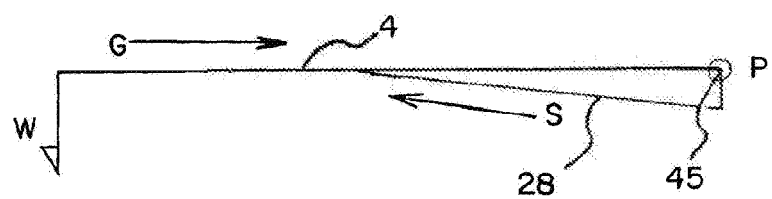
FIG. 19b
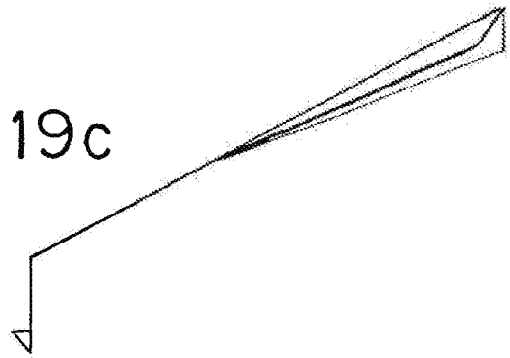
FIG. 19c
FIG. 20
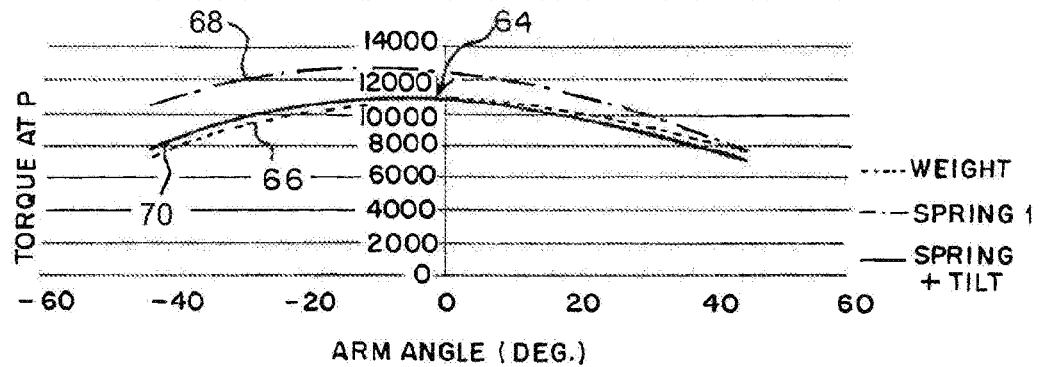
TORQUE AT P GENERATE BY SPRING AND TILT PIVOT
---- WEIGHT
--- SPRING 1
— SPRING + TILT

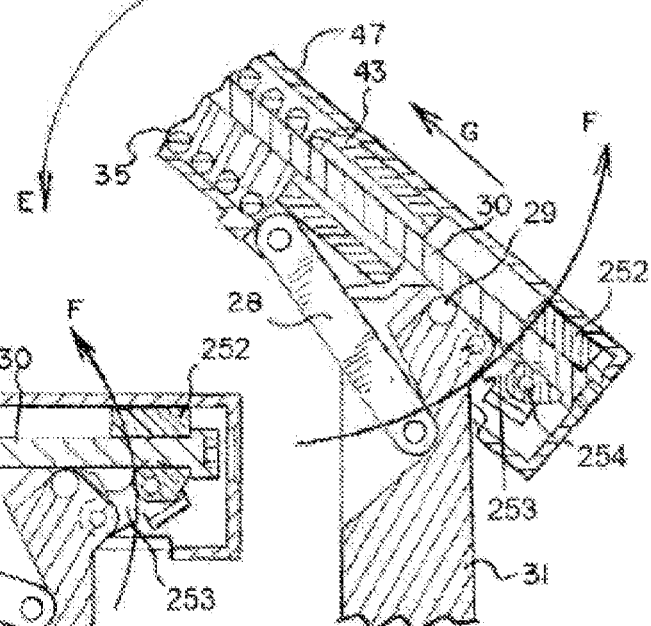
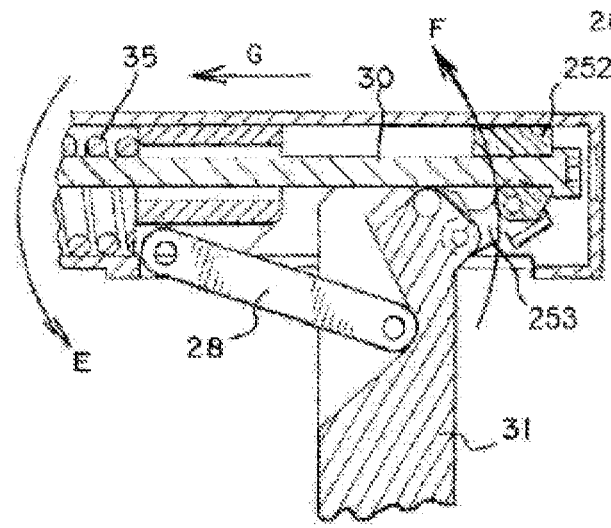
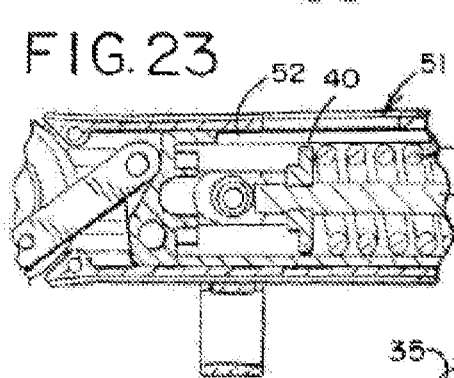
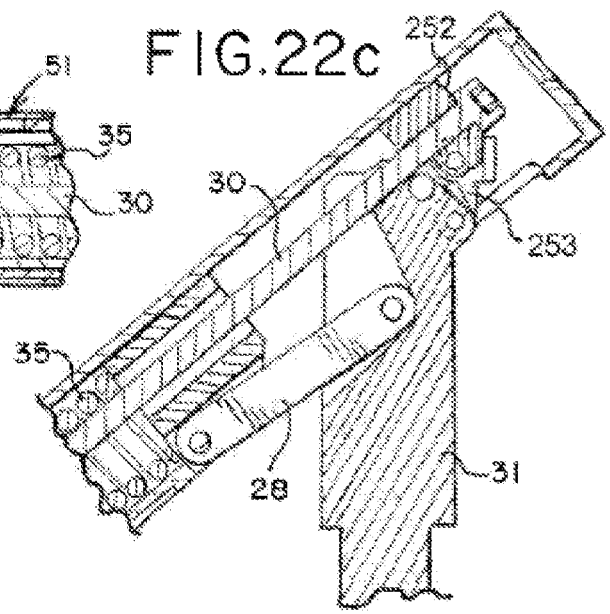

SUPPORT SYSTEM

RELATED APPLICATIONS

This application is a continuation of U.S. patent application Ser. No. 13/024,685 filed Feb. 10, 2011, which claims priority to United Kingdom Patent Application No. GB 1009680.8 filed Jun. 9, 2010.

FIELD OF THE INVENTION

The present invention is concerned with a support system. Particular embodiments of the invention are concerned with a moveable support arm for a monitor or display device.

SUMMARY

In a first aspect, the invention provides a support arm for supporting a load such as a display device, the support arm mounted for pivotal movement about an axis, the support arm comprising: a housing defining an indicator window; a balancing mechanism disposed in the housing and providing a torque about the axis to balance the weight of a display device mounted to the support arm; an adjustment mechanism to adjust the magnitude of the force or torque provided by the balancing mechanism; and an indicator arrangement disposed in the housing, wherein the indicator arrangement is visible in the indicator window and provides a visual indication of the relative force or torque provided by the balancing mechanism.

In some configurations, the housing comprises a pair of casing halves each having an indent, the indents combining to define the indicator window upon joining the casing halves. In some configurations, the balancing mechanism is a resilient member acting against a movable biasing surface and wherein the adjustment mechanism adjusts the position of the biasing surface and thereby alters the force exerted by the resilient member against the biasing surface. In some configurations, the indicator arrangement indicates the position of the biasing surface with a marker. In some configurations, the marker is provided by a portion of the biasing surface. In some configurations, a portion of the biasing surface is visible in the indicator window. In some configurations, the indicator arrangement comprises a marker visible in the indicator window and movable in the window to provide the visual indication of the relative of force or torque provided by the balancing mechanism. In some configurations, the indicator arrangement includes indicia for the visual indication of the relative of force or torque provided by the balancing mechanism. In some configurations, the invention includes a lens disposed in the indicator window, wherein the indicator arrangement includes indicia on the lens for the visual indication of the relative of force or torque provided by the balancing mechanism. In some configurations, the indicia comprise a gradient to facilitate the visual indication of relative force or torque.

In another aspect the invention provides a support device comprising: a first arm that includes housing defining an indicator window, the first arm adapted to support a load; a second arm supporting the first arm, the first arm being pivotable about a first axis with respect to the second arm; a balancing mechanism disposed in the housing and providing a force or torque on the first arm about the first axis; an adjustment mechanism to adjust the magnitude of the force or torque provided by the balancing mechanism to counterbalance the weight of the load supported by the first arm; and an indicator arrangement disposed in the housing, wherein the indicator arrangement is visible in the indicator window and provides a visual indication of the relative force or torque provided by the balancing mechanism.

In some configurations, the load is pivotable with respect to the first arm about a second axis; and the balancing mechanism provides a force or torque on the load about the second axis to counter balance the weight of the load. In some configurations, the housing comprises a pair of casing halves each having an indent, the indents combining to define the indicator window upon joining the casing halves. In some configurations, the invention further comprises a lens in the indicator window. In some configurations, the invention further comprises indicia on the lens for the visual indication of the relative of force or torque. In some configurations, the indicator arrangement includes a portion of the balancing mechanism or adjustment mechanism that is visible through the indicator window to provide the visual indication of the relative force or torque.

In a third aspect, the invention provides a method of adjusting a plurality of support arms each supporting a display device, the method including: positioning a first support arm holding a display device in a high position; adjusting an adjustment mechanism and thereby adjusting the magnitude of a force or torque applied by a balancing mechanism to the first support arm until the display device is balanced in the high position; repositioning the first support arm in a low position; readjusting the adjustment mechanism and thereby readjusting the magnitude of the force or torque applied by the balancing mechanism to the first support arm until the display device is balanced in the low position; observing an indicator arrangement on the first support arm providing an indication of the magnitude of force or torque provided by the balancing mechanism; and adjusting a second support arm by adjusting an adjustment mechanism on the second support arm until an indicator arrangement on the second support arm matches the indicator arrangement of the first support arm.

In some configurations, the first support arm includes a housing comprising a pair of casing halves each having an indent, the casing halves being coupled wherein the indents define an indicator window, wherein observing the indicator arrangement comprises observing the indicator arrangement in the indicator window. In some configurations, observing the indicator arrangement includes observing a portion of the adjustment mechanism or balancing mechanism. In some configurations, observing the indicator arrangement includes observing a portion of the adjustment mechanism or balancing mechanism in relation to indicia on the first support arm.

Preferred embodiments of the present invention will now be described, by way of non-limiting example only, with reference to the attached figures. The figures are only for the purposes of explaining and illustrating preferred embodiments of the invention and are not to be construed as limiting the claims. The skilled man will readily and easily envisage alternative embodiments of the invention in its various aspects.

BRIEF DESCRIPTION OF THE DRAWINGS

FIG. 1 is a perspective view of a first embodiment of the support device;

FIG. 2 is a side view of the support device of FIG. 1;

FIG. 3 is a top view of the support device of FIG. 1;

FIG. 4 is a partially exploded view of the support device of FIGS. 1 to 3;

FIG. 8 is an exploded view of the upper end of the upper arm and the mounting and movement head of FIGS. 1 to 6;

FIGS. 13a to 13c illustrate the variation in torque created about the pivot on the bottom end of the upper arm of FIGS. 1 to 12 by the weight of, for example, a monitor mounted at its upper end, as the support arm pivots about that pivot at its bottom end;

FIG. 14 illustrates the variation in torque created about the pivot on the bottom end of the upper arm of FIGS. 1 to 12 by the weight of, for example, a monitor mounted at its upper end, as the support arm pivots about that pivot at its bottom end;

FIGS. 18a to 18c are cross-sectional views similar to those of FIGS. 12a to 12c illustrating the invention in its third aspect;

FIGS. 19a to 19c illustrate how the torque created at the pivot by the weight of a load on the lower end of the upper support arm is opposed in the arrangement of FIGS. 1 to 12, and 18;

FIG. 20 illustrates how the torque created at the pivot by the weight of a load on the lower end of the upper support arm is opposed in the arrangement of FIGS. 1 to 12, and 18;

FIGS. 22a to 22c are cross-sectional views illustrating the invention in its fourth aspect;

FIG. 23 is an enlarged, cross-sectional view of the encircled portion of the support arm in FIG. 18b;

DETAILED DESCRIPTION OF THE PRESENTLY PREFERRED EMBODIMENTS

Figure 5:
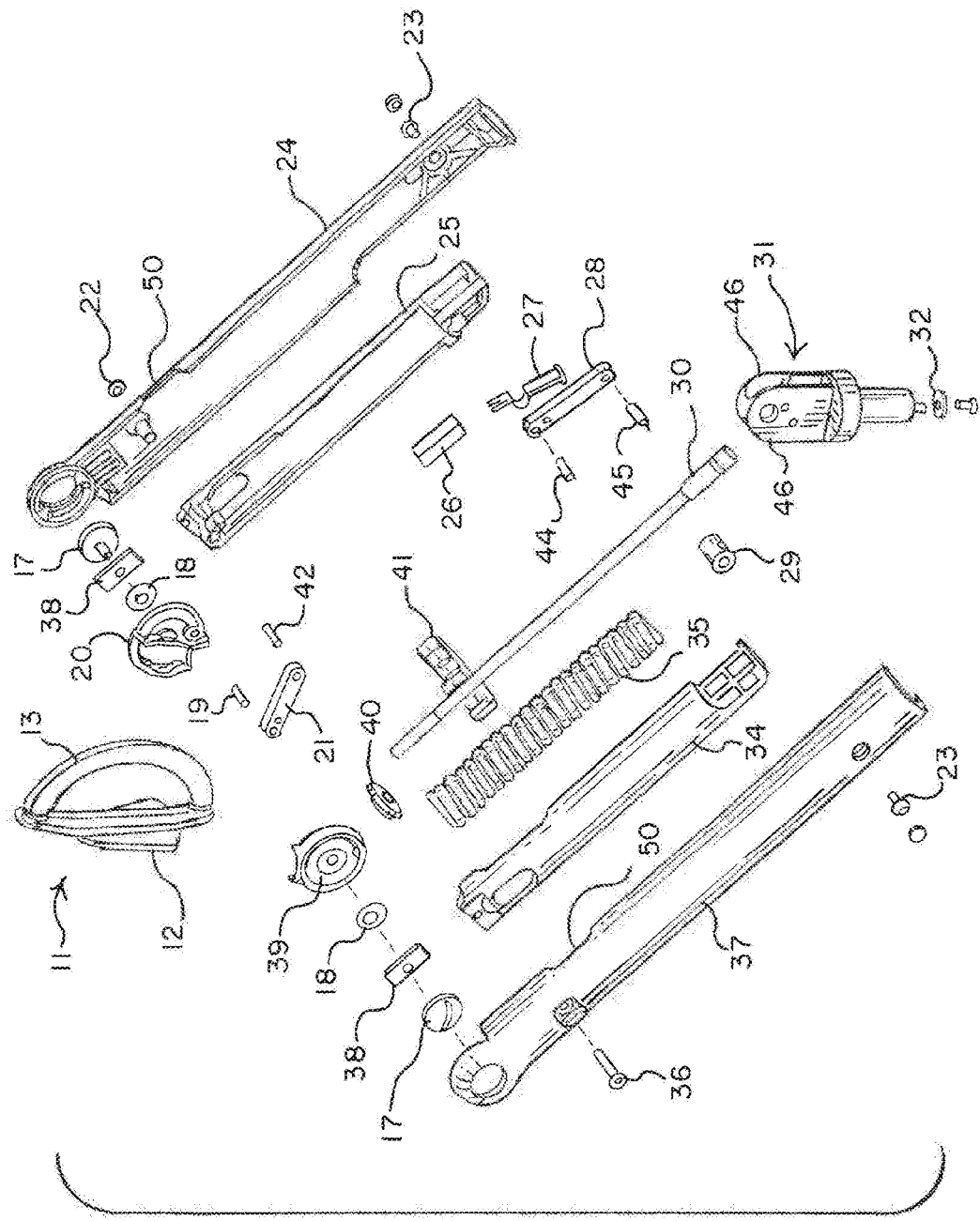
FIG. 5 is an exploded view of the upper arm of the support device of FIGS. 1 to 4.
Figure 7:
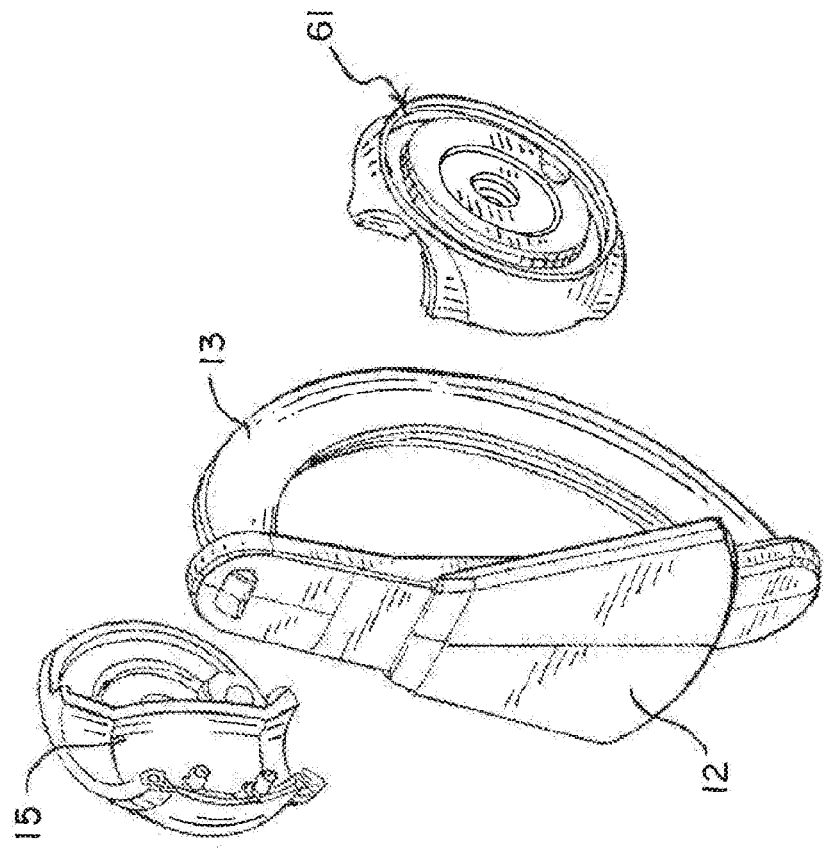
FIG. 7 is a partially exploded view of portions of the mounting and movement head of FIG. 6.
Figure 6:
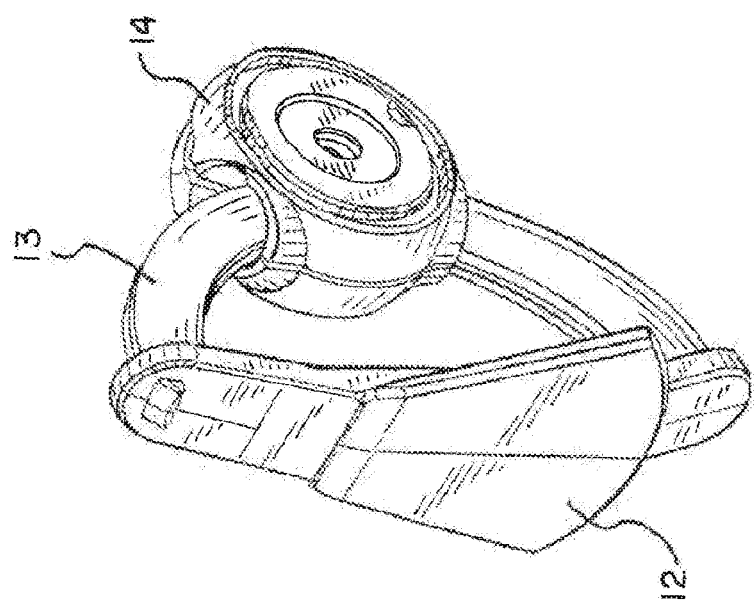
FIG. 6 is a perspective view of the mounting and movement head of the device of FIGS. 1 to 5.

Referring to FIGS. 1 to 4, a support device 1 includes a table securing element 2, a lower arm 3, upper arm 4, monitor mounting head and pivot 5, and a monitor plate 6 for securing to the back of a monitor 201 to be supported. The table securing element 2 has a screw or clamp arrangement for removably securing the element 2 to a table or other surface 203 and an upstanding pin 7 received within a corresponding hole 8 in the end of the lower arm 3 such that the lower arm 3 can rotate about a vertical Y' axis (see FIG. 1) relative to the table securing element 2. The lower arm 3 then has a hole or female coupling 9 at its upper end to receive a pin or male coupling 10 at the bottom end of the upper arm 4. The upper arm 4 can rotate about a vertical axis Y" (see FIG. 1) relative to the lower arm 3 by virtue of this pin and hole engagement.

Referring to FIG. 1, the lower arm 3 can rotate relative to the table securing element 2 about a vertical axis Y', the upper arm 4 can rotate relative to the lower arm 3 about a vertical axis Y" and a horizontal axis X", and (as discussed in more detail below) the mounting head 5 can rotate relative to the distal end of the upper support arm 4 about two orthogonal axes (one substantially horizontal axis X'" and the other substantially vertical axis Y'"). The monitor supporting head 5 can also rotate about a horizontal axis Z'" orthogonal to the X'" and Y'" axes.

Referring to FIGS. 5 to 8, the mounting head 5 comprises a movement joint hoop 11 with a fixing portion 12 for slidable engagement with the monitor supporting plate 6, and a hoop portion 13 of substantially circular cross-section. A motion joint 14 with an internal circular bearing surface 15 corresponding to the circumference of the hoop 13 is positioned on the hoop 13 and can move along the hoop and rotate around the hoop. The motion joint 14 is a two-part plastics moulding. The plastics moulding is held between two projecting portions 16 at the distal end of the upper support arm 4. Slotted screws 17 apply pressure to the outside of each side of the moulding via rectangular nuts and Belleville washers 18 so that the motion joint is frictionally engaged on the hoop.

Figure 9:
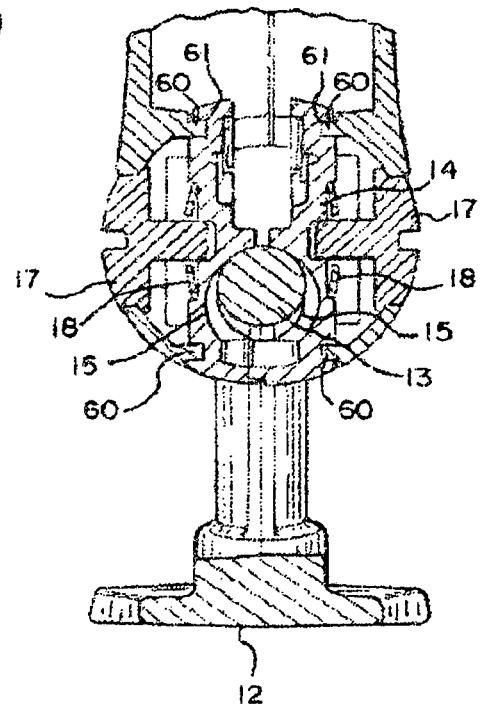
FIG. 9 is a cross-sectional view of aspects of the mounting and movement head along section IX-IX in FIG. 2.

The projecting arms 16 can rotate relative to the motion joint 14 such that the support arm can rotate about horizontal axis X'". Projecting portions 60 (FIG. 9) on the inside of the upper arm projections 16 engage a track 61 (FIG. 7) on the motion joint 14 to allow this relative rotation about axis X'".

Referring to FIG. 5, the support device 1 includes movement joint hoop 11, distal front link pivot pin 19, proximal front link pivot pin 42, motion joint moulding left half 20, motion joint adjustment screws 17, Belleville washers 18, front link 21, thin hex nut 22, mid joint button screws 23, upper arm casing left half 24, spring slider moulding left half 25, friction pad 26, anti-finger trap moulding 27, power link 28, mid joint pivot pin 29, force adjustment screw 30, mid joint 31, steel washer 32, spring slider moulding right half 34, compression spring 35, head screw 36, upper arm casing right half 37, rectangular nuts 38, motion joint moulding right half 39, spring nut plate 40 and cable management clip 41. The upper arm casing left half 24 and upper arm right half 37 are collectively referred to as the support arm casing 47 (FIGS. 12a-12c, 22)

Figure 10A:
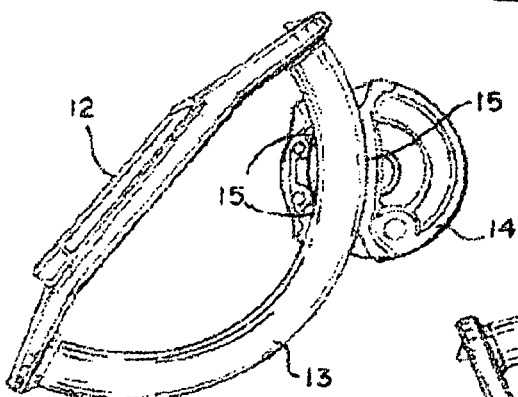
FIGS. 10a and 10b are cross-sectional views along part of section 10-10 in FIG. 3 illustrating adjustment of the mounting and movement head in a first plane.
Figure 10B:
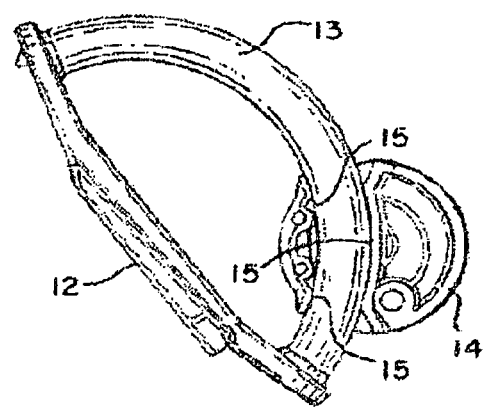

As illustrated in FIGS. 10a and 10b, the motion joint 14 can move relative to the hoop 13. In this application we will usually refer to movement of the motion joint along the hoop. This expression refers to relative movement in a direction along the curvature of the hoop and includes movement of the motion joint with the hoop remaining still, movement of the hoop with the motion joint remaining still and movement of both the motion joint and hoop.

Figure 11A:
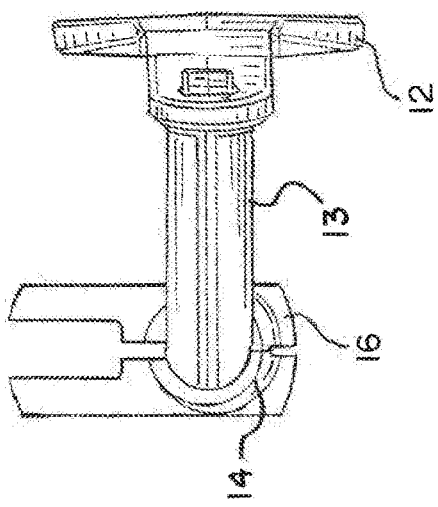
FIGS. 11a to 11c are top views of the mounting and movement head illustrating adjustment of the mounting and movement head in a second plane orthogonal to the plane of the section of FIGS. 10a and 10b.
Figure 11B:
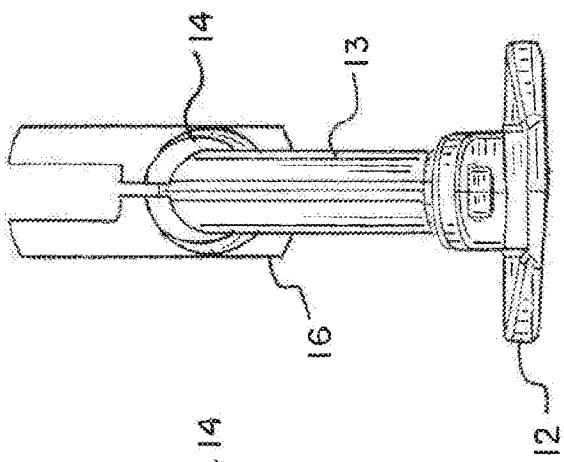
Figure 11C:
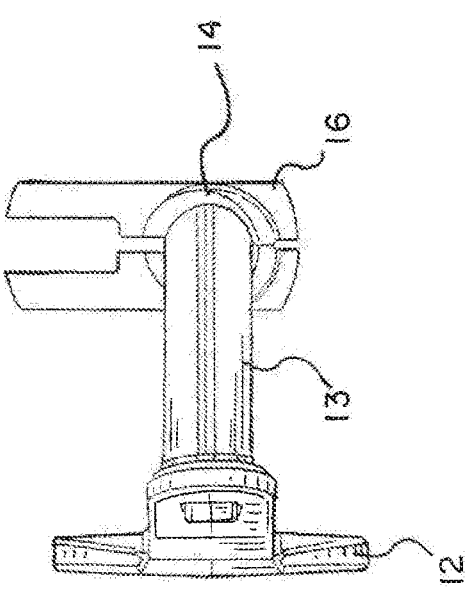

In a particularly preferred embodiment of the invention, the hoop 13 lies on the circumference of a circle whose centre lies at or near the centre of gravity of the monitor or other element being supported on the mounting head. This reduces the magnitude of the frictional force which the bearing surfaces 15 of the motion joint must apply to the hoop in order to hold its position on the hoop. As illustrated in FIGS. 11a to 11c, the motion joint 14 can also rotate relative to the hoop 13 and a combination of the movement along and about the hoop means that the, for example, monitor 201 on the mounting head 5, can be rotated about orthogonal X''' and Y''' axes. In this application we usually refer to rotation of the motion joint about the hoop. This expression refers to relative rotation about a curved axis running down the middle of the hoop and includes rotation of the motion joint with the hoop remaining still, rotation of the hoop with the motion joint remaining still and rotation of both the motion joint and hoop.

The mount fixing portion 12 is held in a turntable like portion of the monitor supporting plate 6 such that the monitor supporting plate 6 can rotate relative to the mount fixing portion 12 about axis Z'' (see FIG. 1).

Figure 12A:
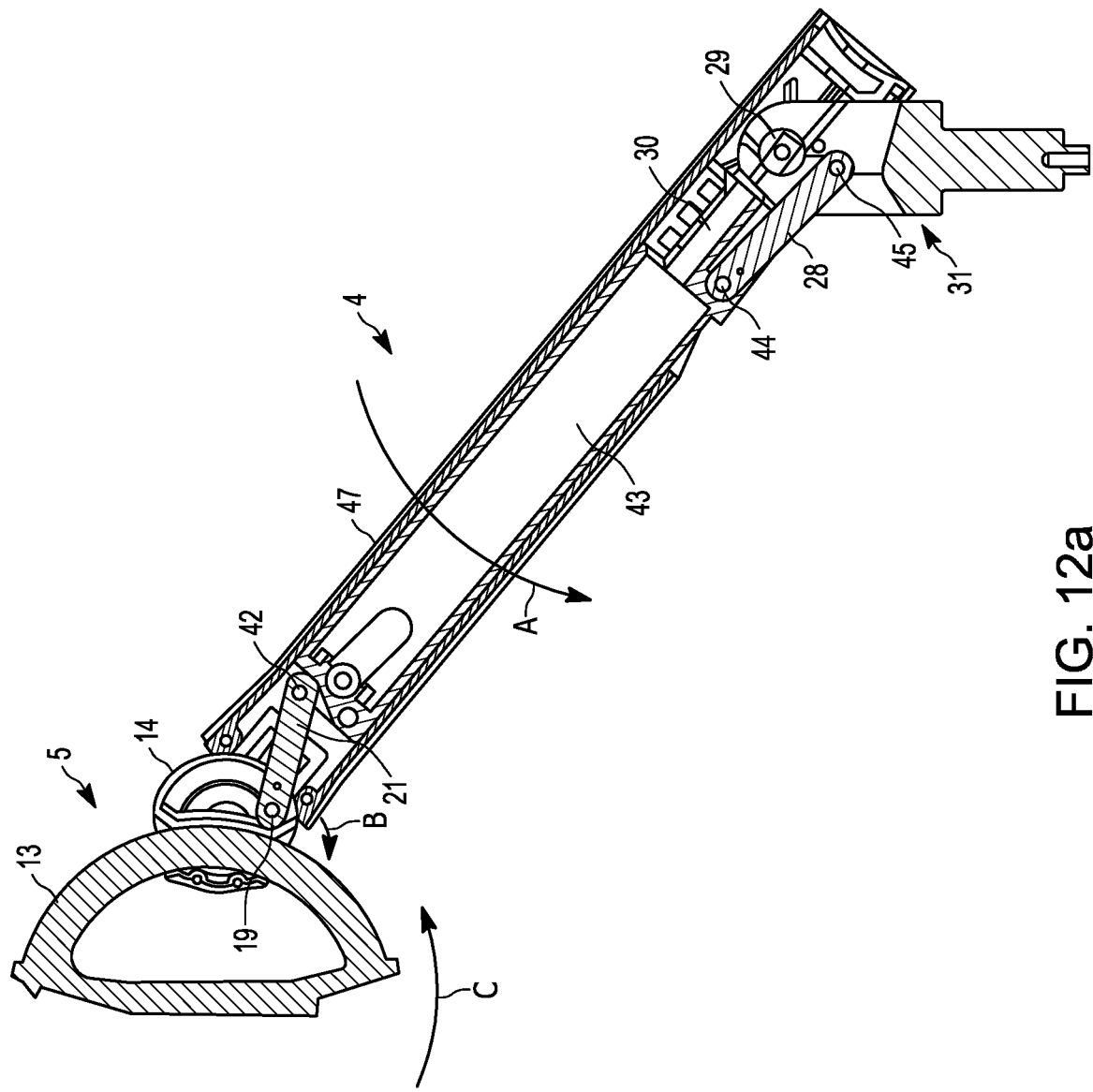
FIGS. 12a to 12c are cross-sectional views along part of section 12-12 of FIG. 3 which illustrate the invention in its second aspect as the upper support arm pivots.

The upper support arm 4 is a two-part metal casting whose two halves 24, 37 (FIG. 5) form a support arm casing 47 and are held together by a screw and nut coupling 36, 22 towards the distal end of the upper support arm and a pair of proximal mid-joint button screws 23 which each pass through a pair of holes in the upper end of the mid joint 31 and engage opposite ends of the mid joint pivot pin 29 so that the upper support arm 4 can pivot about that mid joint pivot pin 29 and hence about horizontal axis X'' (see FIG. 1). The distal end of each half of the upper support end casing forms one half 16 of a U-shaped motion joint fixing portion so that together the two halves of the casing capture the motion joint 14 as described above (see FIGS. 8 and 9). With reference to FIG. 12a, an upper support arm front link 21 is mounted at its distal end on the distal front link pivot 19 held between the two halves 20, 39 of the motion joint 14 and at its proximal end on a proximal front link pivot pin 42 pivotally mounted on the distal end of a sliding carriageway or spring slider 43 supported within the upper arm casing. The spring slider 43 is a two-part moulding 25, 34 and the proximal front link pivot pin 42 is held between the distal ends of the two halves to support the front link 21.

The spring slider 43 has a compression spring 35 (FIG. 5, not shown in FIGS. 12a to 12c) inside it which engages at its distal end with a spring nut plate 40 mounted on the distal end of a force adjusting screw 30. At initial set up or final manufacture of the support device 1, the force adjusting screw 30 is set to define a particular separation between the spring nut plate 40 and the proximal end of the spring slider 43. This defines the length of the space for the compression spring 35 and hence determines the force supplied by the spring 35. The force adjusting screw 30 can adjust the position of the spring nut plate 40 within the spring slider moulding and thereby increase or decrease the length of the compression spring and hence, respectively, decrease or increase the force that spring 35 will apply to the spring slider 43 and spring nut plate 40, and hence to the rear power link 28 pivotally connected to the proximal end of the spring slider 43 against which the proximal end of the spring 35 acts.

Figure 24:
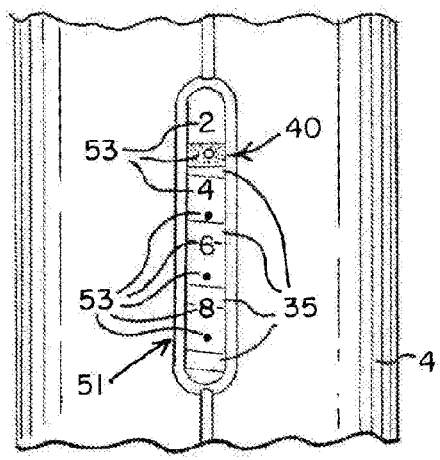
FIG. 24 is an enlarged view of the portion encircled in FIG. 3, illustrating a first configuration of an indicator window arrangement.
Figure 25:
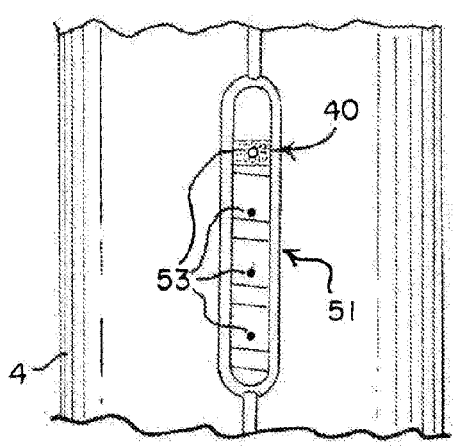
FIG. 25 is a view similar to FIG. 24 with a second configuration of an indicator window arrangement.
Figure 26:
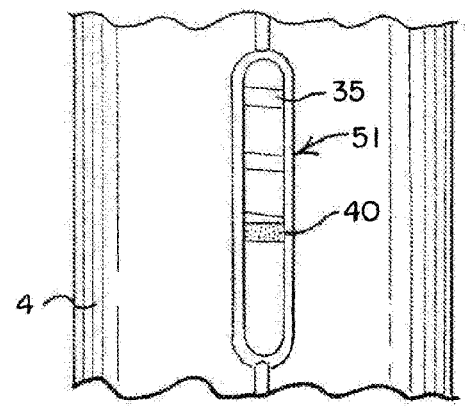
FIG. 26 is a view similar to FIG. 24 with a third configuration of an indicator window arrangement.
Figure 27:
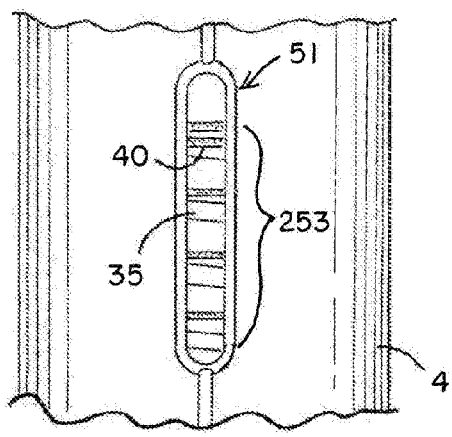
FIG. 27 is a view similar to FIG. 24 with a fourth configuration of an indicator window arrangement.
Figure 28:
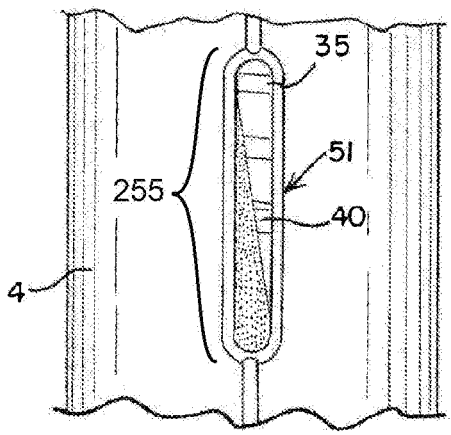
FIG. 28 is a view similar to FIG. 24 with a fifth configuration of an indicator window arrangement.

Referring to FIGS. 1, 3 and 5, the two casing halves 24, 37 each have indents 50 which, when the upper arm is assembled, together define an indicator window 51 into which a lens 52 (FIG. 23) is fitted. When assembled (see FIGS. 23-26) the spring nut plate 40 is visible through the indicator window 51, and functions as a marker. As shown in the embodiment of FIGS. 24 and 25, the indicator window 51 includes markings 53, or indicia, positioned adjacent the marker, for example on the lens 52. Alternatively, the markings 53 may be positioned on the support arm casing 47 adjacent the window 51. The visible spring nut plate 40 acts as a marker and combines with the indicia 53 to provide an indication of the position of the spring nut plate 40 relative to the support arm casing 47, and hence the spring force applied by the spring 35. As shown in FIG. 26, the spring nut plate 40 alone, as viewed through the window 51, may provide the requisite indicia, by noting the relative position of the marker in the window 51 (see, e.g., FIG. 26). In all embodiments, the position of the spring nut plate 40, as it moves in the window 51, provides a measure of the length of the spring 35 and hence of the biasing and the spring force provided by the spring 35. The indicia 53 may take the form of alpha-numeric characters, such as numbers or letters (see, e.g., FIG. 24), or various symbols, such as dots or lines (see, e.g., FIG. 25), such that the installer can note the relative position of the marker to the indicia. As shown in FIGS. 27 and 28, the indicia may form a gradient 253, 255, such as a tapered gradient 255 or a plurality of spaced part markings, such as lines 253, that are progressively thicker or darker, or a combination thereof. The gradient may also be defined by relative shading, by an increase in numerical value, etc. In this way, the installer may be apprised that the tension force is being increased as the marker moves along the increasing gradient, however identified.

As shown in FIGS. 22a-c and 23, the position of the spring nut plate 40 is adjusted by the force adjusting screw 30, and moves in the window 51, until the torque produced by the weight of the display device or monitor matches the torque provided by the spring 35 at all orientations of the display device. The display device or monitor should feel like it is floating at all orientations.

The best orientation for adjustment is as shown in FIG. 22b; the back of the monitor is at 90° to the upper support arm which is itself at 90° to the lower support arm. This position allows for easier and more precise adjustment.

An installation operative places the monitor and support arm in the position shown in FIGS. 22a-c and then adjusts the force adjustment screw 30 using a screwdriver or Allen (or hex) key by trial and error until the torques are balanced and the monitor floats in all monitor height positions. The operative then reads off the indication setting of the first installed arm by noting the position of the spring nut plate 40 in the indicator window 51 relative to the markings. The read and noted indicator settings can then be used as the initial setting for further similar installations. Further trial and error may be necessary to fine tune any such further installations.

Figure 12B:
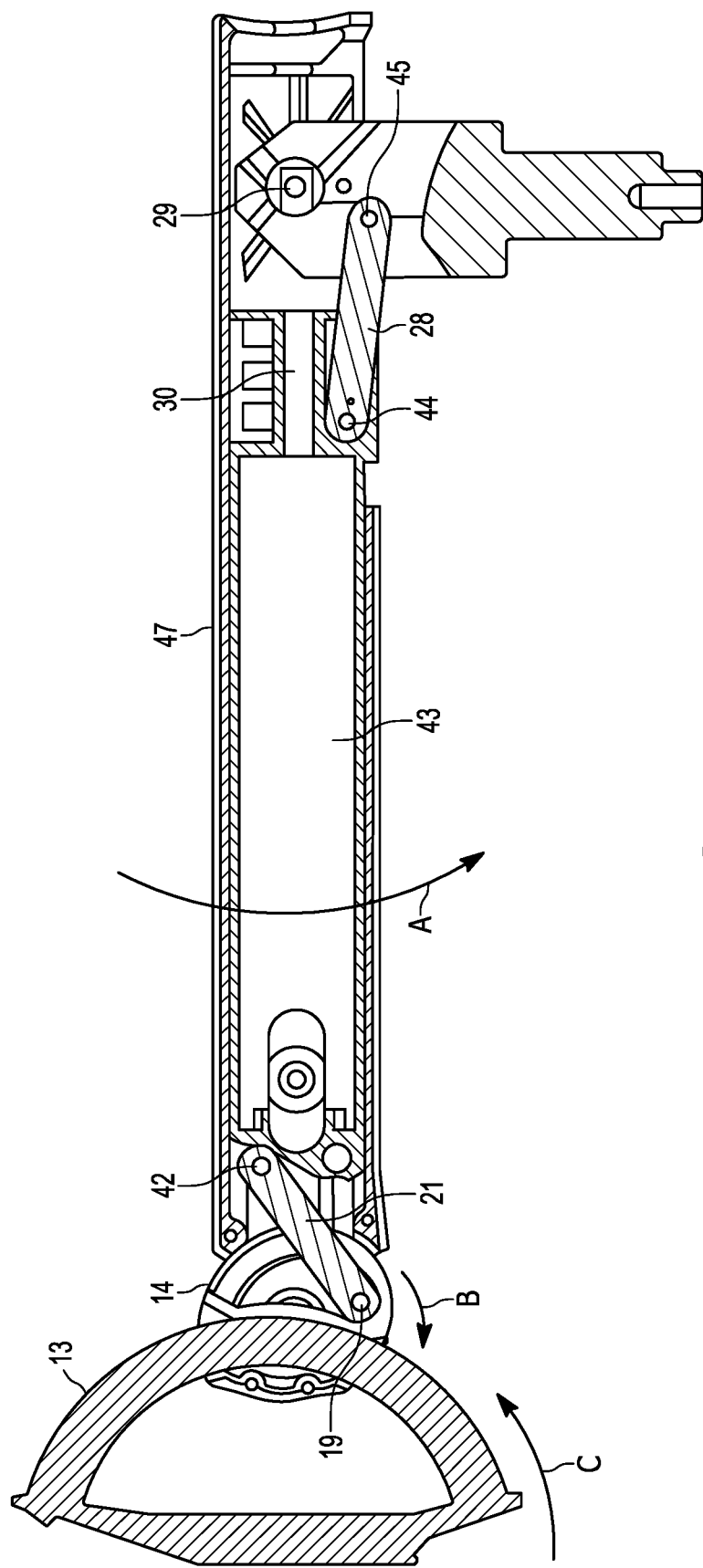
Figure 12C:
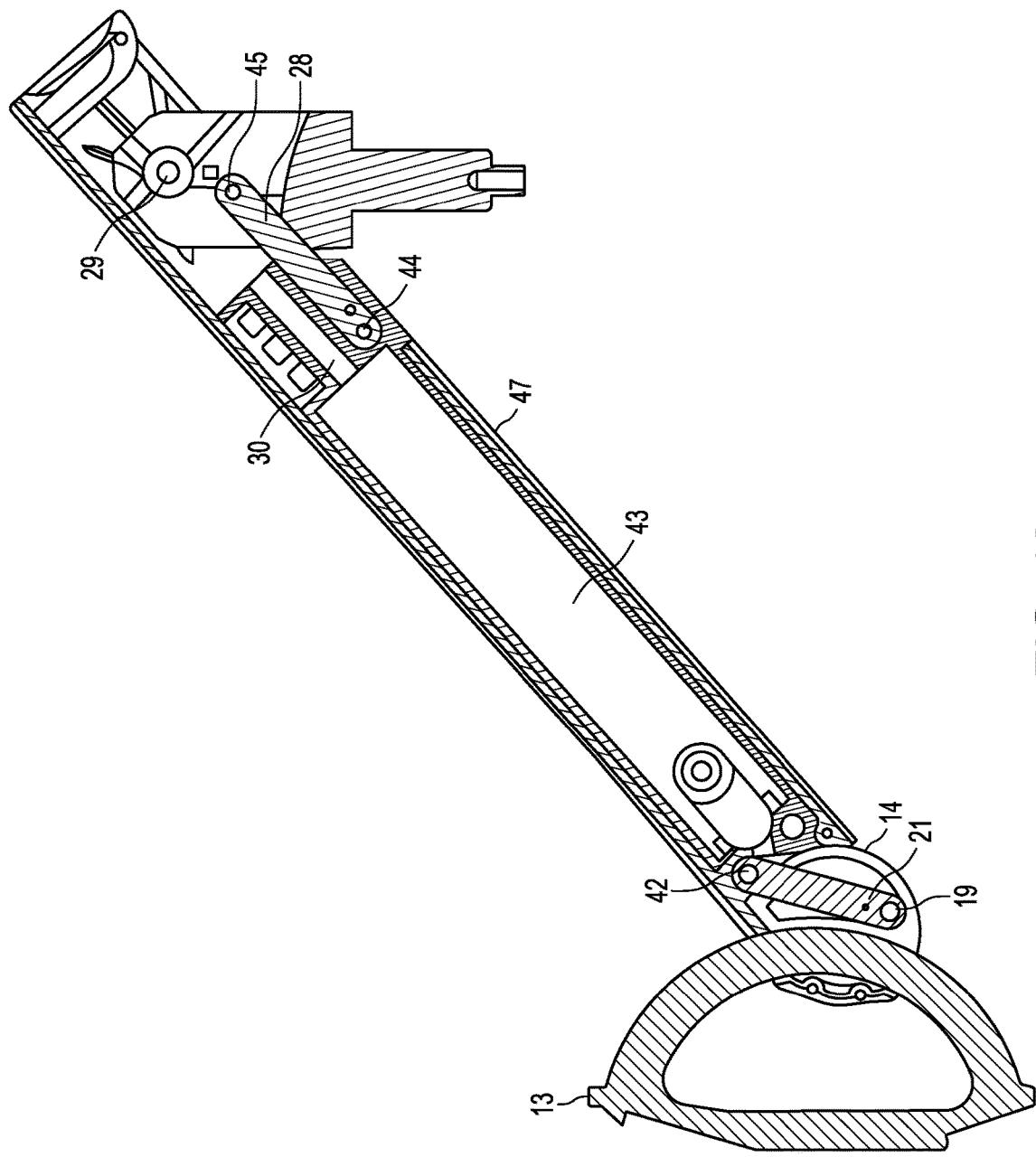

Referring to FIGS. 12a-c, the rear power link 28 is arranged between the proximal end of the spring slider 43 and the mid-joint 31 so as to transmit the force from the compression spring 35 to the mid-joint 31. The rear power link 28 is connected to the spring slider 43 at the rear power link's distal end by a distal rear link pivot pin 44 held between the two moulding halves 25, 34 of the spring slider 43 and is connected to the mid-joint 31 by a proximal rear link pivot pin 45 held between two upstanding portions 46 of the U-shaped mid-joint 31. The proximal rear link pivot pin 45 is located on the mid-joint below the upper arm pivot point 29 and at a position forward or distal from the vertical axis passing through that support arm pivot point 29.

As will be discussed in more detail below, the combination of the support arm casing 47 pivotally coupled at its proximal end to the mid-joint 31 and at its distal end to the motion joint 14, combined with the internal slider 43 coupled at its distal end via the front link 21 and at its proximal end via the rear power link 28 means that a monitor supported on the mounting head remains in substantially the same plane as the upper support arm 4 pivots about the mid-joint 31 in the manner shown in FIGS. 12a, 12b and 12c.

Referring to FIGS. 12a to 12c, as the upper support arm 4 pivots about the mid-joint pivot pin in direction A from, for example, the position shown in FIG. 12a to the position shown in FIG. 12b (or, for example, the position shown in FIG. 12b to the position in FIG. 12c), the rear power link 28 pushes the slider 43 in the support arm casing 47 towards the motion joint 14. This then causes the front link 21 to push its pivot point on the motion joint forward. As the distal front link pivot pin 19 is located on the motion joint 14 at a point below the pivot or axis of rotation X''' between the motion joint 14 and the support arm casing 47, this causes the motion joint 14 to rotate in direction B relative to the support arm casing 47 and thereby reduce or prevent tilting of the monitor relative to its original plane. If there were no movement of the motion joint in direction B relative to the support arm casing 47, a monitor held on the mounting head would tilt in direction C as the support arm was rotated in direction A.

As shown in, for example, FIGS. 1, 12a, 12b and 12c, in order to raise and/or lower a monitor fixed to the monitor supporting head 5 relative to the lower arm 3 and hence the table surface 203 on which the support device 1 is mounted, the upper support arm 4 can be rotated from its highest position (see FIG. 12a), approximately 45 degrees above the horizontal down to its lowest position (see FIG. 11c), approximately 45 degrees below the horizontal. The spring 35 inside the support arm 4 acts on the mid-joint 31 via the rear link 28 to produce a torque which counter-acts the torque produced by the weight of the monitor. The maximum distance and hence torque is when the arm is horizontal (see FIGS. 12b and 13b) and at its minimum when in its uppermost (see FIGS. 12a and 13a) and lowermost (see FIGS. 12c and 13c) positions.

As can be seen from FIG. 13, the distance of the monitor from its centre of gravity to the mid-joint pivot P, is at its greatest when the upper support arm is horizontal (FIG. 13b) and lowest when the monitor is in either its uppermost (FIG. 13a) or lowermost (FIG. 13c) positions.

This means that (as shown in FIG. 14) the torque at the mid joint pivot 29 (P in FIGS. 13 and 14) created by the monitor weight is at a maximum when the arm angle to the horizontal is 0° and at a minimum at the ends of its range of movement which are +45° and −45° in the illustrated example. The graph of FIG. 14 is an illustration of the magnitude of the torque at P (i.e. pivot point 29) created by a monitor weight which assumes a monitor weight of 40 N, an arm length of 265 mm and a range of movement of +/−45° from the horizontal.

Figure 15A:
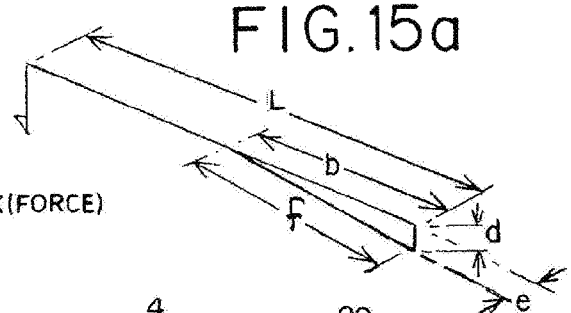
FIGS. 15a to 15c illustrate the variation in torque created about the pivot on the bottom end of the upper arm of FIGS. 1 to 12 by the weight of, for example, a monitor mounted at its upper end, as the support arm pivots about that pivot at its bottom end.
Figure 15B:
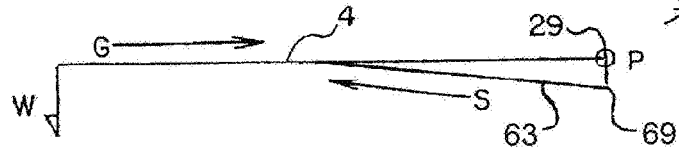
Figure 15C:
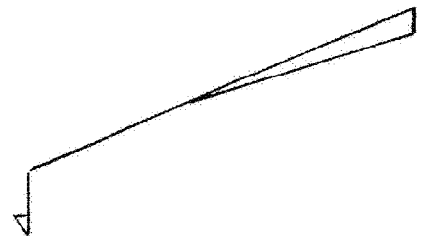

The known arrangements (see FIG. 15) for opposing the torque created at the pivot point 29 by the load at the distal end of the support arm use a spring force G created by either a mechanical spring or gas spring inside the upper support arm 4. This spring force G is transmitted via a rear power link 63 of length of which acts through proximal rear link pivot point 69 at a distance d vertically below the main support arm pivot point P (or 29). The torque T at P generated by the spring force G is the product of the force S in the rear power link 63 and the distance d. Force S is equal to the component of spring force G along the direction of the rear power link 63.

Figure 16:
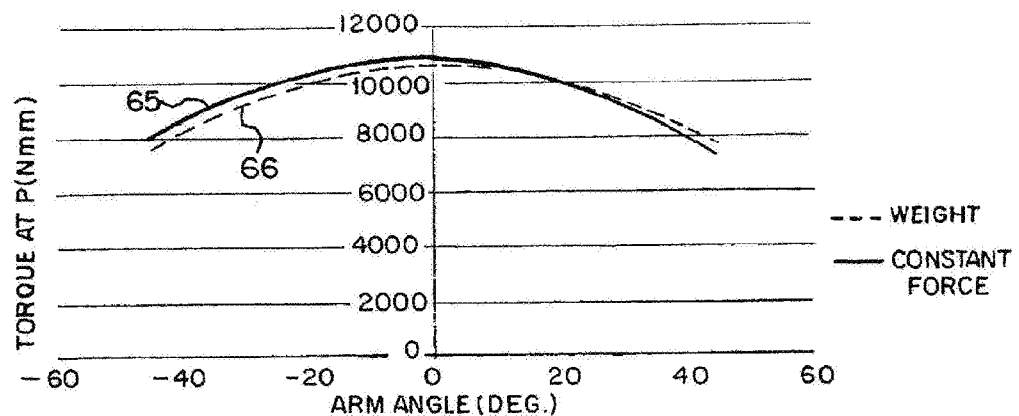
FIG. 16 illustrates how the torque of FIGS. 13 and 14 is opposed in known support device arrangements.

Referring to FIG. 16, if the spring force G is constant and the range of movement of the support arm is +/−45° from the horizontal, then the variation in T is as shown in FIG. 16 by the constant force line 65. The torque T varies as the support arm pivots because the component of the spring force G along the direction of the rear power link 63 varies as this pivots relative to the upper support and the direction of the spring force G. As can be seen in FIG. 16, the torque created by the constant spring force in the known arrangement of FIG. 15 does not vary in the same way as the torque created by the weight of the load W (line 66 in graph). In particular, the peak weight-opposing torque (i.e. the torque produced by the spring force G) is not at the same position as the peak torque created by the load weight. Furthermore, if the spring force is created by a mechanical spring such as a compression spring, the differences are even greater (see FIG. 16 wherein the variation in torque from a compression spring is line 67)). This is because the magnitude of the spring force G varies as the spring is compressed to varying degrees as the upper support arm rotates.

In the embodiment of the invention shown in FIGS. 12a to 12c, the torque produced by the weight of the monitor (see FIGS. 13a to 13c, 19a to 19c, and 20) is opposed by a torque which is the product of the spring force created by the compression spring 35 in the rear power link 28 and the perpendicular distance e between the line of that force and the proximal rear link pivot pin 45 (see FIGS. 19a to 19c and 20).

As shown in FIGS. 18a to 18c, the proximal rear link pivot pin 45 of the described embodiment of the invention is located forward (or distal) from the axis W (see FIG. 18b) through the mid-joint pivot 29 which is orthogonal to the longitudinal axis of the upper support arm at the mid-point of range of movement of the upper support arm; i.e. the proximal rear link pivot pin 45 is forward of a vertical axis through the mid-joint pivot 29 when the upper support arm can move between +/−45° to the horizontal.

As illustrated in FIGS. 19 and 20 where line 68 illustrates the variation in torque created about the pivot pin 29 by the compression spring 35 acting via the rear power link 28, this position of the proximal rear link pivot pin 45 moves the peak torque about mid-joint pivot 29 created by the spring 35 acting through the rear power link 28. Careful selection of the geometry and/or dimensions of the element (and their relative geometry and dimensions) making up the proximal end of the upper support arm 4 (including the rear link 28; pivots 29, 44, 45) leads to the spring and tilt line 70 in FIG. 20 according to the present invention. The spring properties and the load weight on the spring and tilt line 70 allow one to move the position of peak opposing torque 64 (see FIG. 20) to a position closer to the position of the peak load weight torque of line 66.

The placing of the proximal rear link pivot pin 45 at a position forward or distal from the proximal support arm pivot 29 (e.g. position shown in FIG. 12b) means that the perpendicular distance d varies in a manner which is closer to the variation in the torque caused by the weight of the monitor than is the case in the known arrangements which have the rear link pivot point in line with a vertical line through the proximal support arm pivot (where the mid-point of the range of movement is the horizontal). In the described embodiment, the mid-point of the range of movement of the support arm about axis X" is the horizontal so that the relevant axis through the pivot 29 is vertical. However, in alternative embodiments with a different range of movement, the relevant axis through the proximal pivot support arm 29 might not be vertical.

Figure 17:
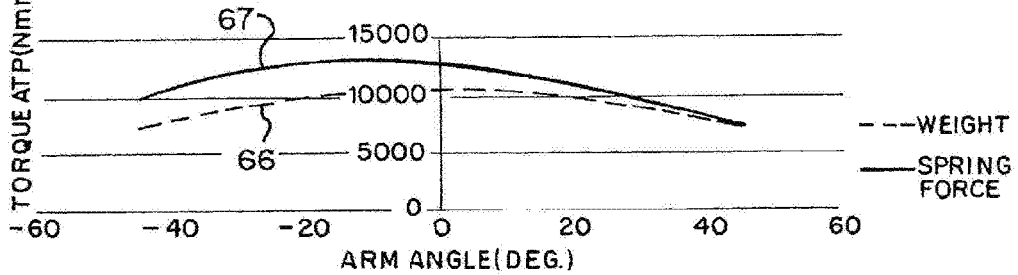
FIG. 17 illustrates how the torque of FIGS. 13 and 14 is opposed in known support device arrangements.
Figure 21A:
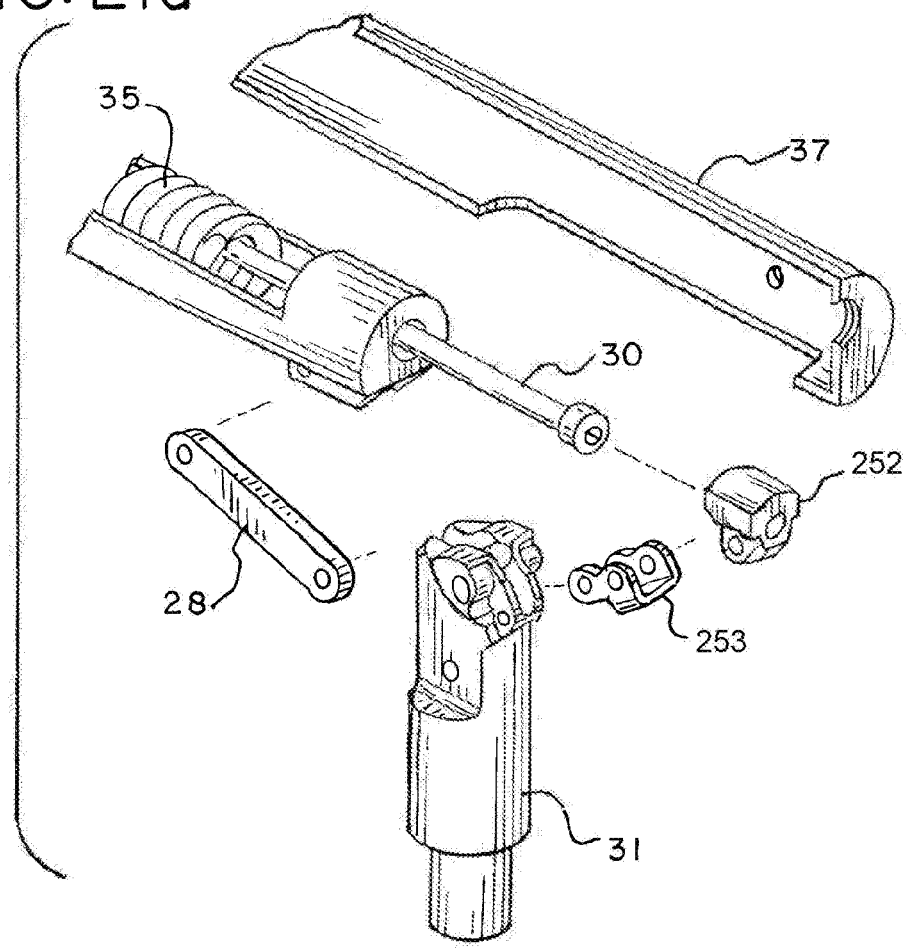
FIGS. 21a and 21b illustrate a detail at the bottom end of the upper support arm in an alternative embodiment of the invention.
Figure 21B:
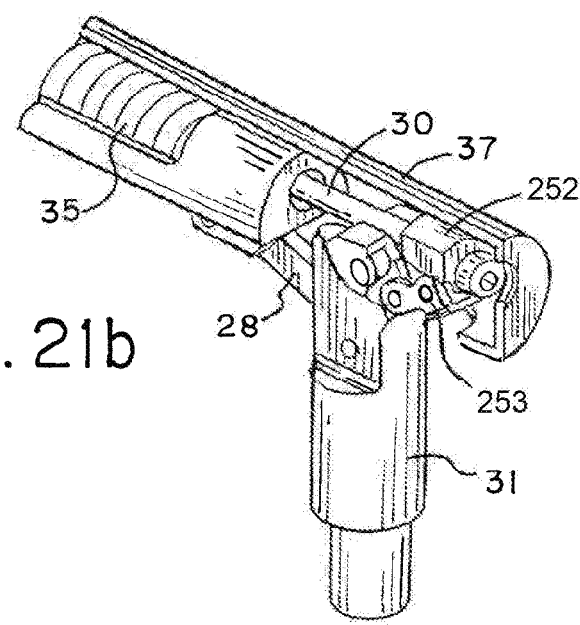

Referring to FIGS. 18a to 18c, as the support arm 4 rotates from its uppermost position (see FIG. 18a), through the mid-position (see FIG. 18b) down to its lowermost position (18c), the rear power link 28 progressively compresses the spring 35 by pushing it against the fixed spring nut plate 40. This means that the force provided by the spring 35 progressively increases as the support arm 4 is lowered in a manner similar to that discussed above in connection with FIG. 17.

In an alternative embodiment of the invention illustrated in FIGS. 21a, 21b and 22a to 22c, the increasing spring force which results as the spring 35 is compressed as illustrated in FIGS. 18a to 18c as the support arm moves from its uppermost (see FIG. 22a) to is lowermost (see FIG. 22c) position and progressively compresses the spring 35 further, is modified or controlled by modifying or controlling the degree of compression of the spring inside the support arm 4 so as to optimise or improve the spring load relative to the variations in the torque created by the monitor weight as the support arm moves through its range of movement about the horizontal axis X".

In the alternative embodiment of FIGS. 21 and 22, the force adjusting screw 30 is held by a screw holding element 252 rather than then end of the support arm casing as in the embodiment of FIGS. 1 to 12 and 18. This screw holding element 252 is connected to the mid-joint 31 by a spring adjustment link 253 which is itself connected at its ends to the mid joint and screw holding element by pivot pins 254.

As the upper support arm 4 moves from its uppermost position (FIG. 22a) through the horizontal position (FIG. 22b) and onto its lowermost position (FIG. 22c), the pivoting action in direction E causes the spring adjustment link 253 to pivot in direction F. This pivoting of the spring adjustment link 253 then moves the force adjustment screw 30 towards the distal end of the support arm in direction G and hence moves the spring nut plate 40 away from the proximal end of the spring 35. This movement therefore reduces the degree of compression of the spring 35 and hence the spring force as the support arm is rotated from its uppermost to its lowermost position.

Although the present invention has been described with reference to preferred embodiments, those skilled in the art will recognize that changes may be made in form and detail without departing form the spirit and scope of the invention. As such, it is intended that the foregoing detailed description be regarded as illustrative rather than limiting and that is the appended claims, including all equivalents thereof, which are intended to define the scope of the invention.

What is claimed is:

1. A support arm for a display device comprising:
   a base element;
   a housing having a first end connected to a mounting head for a display and a second end configured for pivotal movement about the base element, the housing defining an indicator window and an adjustment opening spaced from the indicator window and positioned in the second end;
   a balancing mechanism disposed in the housing and providing a torque about an axis;
   an adjustment mechanism to adjust the torque provided by the balancing mechanism, wherein the adjustment mechanism is accessible to a user through the adjustment opening; and
   an indicator arrangement disposed in the housing, wherein the indicator arrangement is visible in the indicator window and provides a visual indication of the torque provided by the balancing mechanism,
   wherein the balancing mechanism includes,
   a slider moveable along a longitudinal axis of the housing;
   a first link pivotally connected to a proximal portion of the slider and pivotally connected to the base element, a first proximal pivot coupling the first link to the base element and a first distal pivot coupling the first link to the slider; and
   a second link pivotally connected to a distal portion of the slider and the mounting head, a second distal pivot coupling a distal portion of the slider to the mounting head and a second proximal pivot coupling the second link to the slider, wherein the slider holds the distance between the first distal pivot and the second proximal pivot constant.

2. The support arm of claim 1, wherein the housing comprises a pair of casing halves each having an indent, the indents combining to define the indicator window upon joining the casing halves.

3. The support arm of claim 1, wherein the balancing mechanism includes a resilient member acting against a movable biasing surface and wherein the adjustment mechanism adjusts a position of the biasing surface and thereby alters a force exerted by the resilient member against the biasing surface.

4. The support arm of claim 3, wherein the indicator arrangement indicates the position of the biasing surface with a marker.

5. The support arm of claim 4, wherein the marker is provided by a portion of the biasing surface.

6. The support arm of claim 3, wherein a portion of the biasing surface is visible in the indicator window.

7. The support arm of claim 1, wherein the indicator arrangement comprises a marker visible in the indicator window and movable in the window to provide the visual indication of the torque provided by the balancing mechanism.

8. The support arm of claim 1, wherein the indicator arrangement includes indicia for the visual indication of the torque provided by the balancing mechanism.

9. The support arm of claim 1, further comprising a lens disposed in the indicator window, wherein the indicator arrangement includes indicia on the lens for the visual indication of the torque provided by the balancing mechanism.

10. The support arm of claim 9, wherein the indicia comprises a gradient to facilitate the visual indication of the torque.

11. A support device comprising:
    a base element;
    a first arm connected to the base element, the first arm including a housing having a first end receiving a rotatable joint and an opposite second end having an adjustment opening, the housing defining an indicator window positioned between the first and second ends;
    a second arm supporting the first arm, the first arm being pivotable about a first axis with respect to the second arm, the first axis is positioned between the indicator window and the adjustment opening;

a balancing mechanism disposed in the housing and providing a force on the first arm about the first axis;

an adjustment mechanism to adjust the magnitude of the force provided by the balancing mechanism, wherein the adjustment mechanism is accessible to a user through the adjustment opening; and an indicator arrangement disposed in the housing, wherein the indicator arrangement is visible in the indicator window and provides a visual indication of the force provided by the balancing mechanism, wherein the balancing mechanism includes, a slider moveable along a longitudinal axis of the housing, a first link pivotally connected to a proximal portion of the slider and pivotally connected to the base element, a first proximal pivot coupling the first link to the base element and a first distal pivot coupling the first link to the slider, and a second link pivotally connected to a distal portion of the slider and the rotatable joint, a second distal pivot coupling a distal portion of the slider to the rotatable joint and a second proximal pivot coupling the second link to the slider, wherein the slider holds the distance between the first distal pivot and the second proximal pivot constant.

12. The support device of claim 11, wherein the balancing mechanism provides a force about a second axis.

13. The support arm of claim 11, wherein the housing comprises a pair of casing halves each having an indent, the indents combining to define the indicator window upon joining the casing halves.

14. The support arm of claim 11, further comprising a lens in the indicator window.

15. The support arm of claim 14, further comprising indicia on the lens for the visual indication of the force.

16. The support arm of claim 11, wherein the indicator arrangement includes a portion of the balancing mechanism or adjustment mechanism that is visible through the indicator window to provide the visual indication of the force.

\* \* \* \* \*